(12) United States Patent
Naaman

(10) Patent No.: US 12,711,413 B2
(45) Date of Patent: Aug. 18, 2026

(54) PARAMETRIC AMPLIFIERS WITH INDUCTIVE INPUT COUPLING FOR QUANTUM COMPUTING SYSTEMS

(71) Applicant: Google LLC, Mountain View, CA (US)

(72) Inventor: Ofer Naaman, Santa Barbara, CA (US)

(73) Assignee: GOOGLE LLC, Mountain View, CA (US)

( * ) Notice: Subject to any disclaimer, the term of this patent is extended or adjusted under 35 U.S.C. 154(b) by 692 days.

(21) Appl. No.: 18/176,394

(22) Filed: Feb. 28, 2023

(65) Prior Publication Data

US 2024/0289666 A1 Aug. 29, 2024

(51) Int. Cl.
*G06N 10/40* (2022.01)
*H03F 7/00* (2006.01)
*H03F 19/00* (2006.01)

(52) U.S. Cl.
CPC ............... *G06N 10/40* (2022.01); *H03F 7/00* (2013.01); *H03F 19/00* (2013.01)

(58) Field of Classification Search
CPC ........................................................ H03F 7/00
See application file for complete search history.

(56) References Cited

U.S. PATENT DOCUMENTS 10,491,178 B2 11/2019 Naaman et al.
2022/0140927 A1* 5/2022 Bronn .................... H10N 69/00 370/480
2023/0119964 A1* 4/2023 Beck ...................... G06N 10/40 257/31

OTHER PUBLICATIONS

Institute of Electrical and Electronics Engineers Microwave Theory and Techniques Society's International Microwave Symposium (IMS) Program Book, May 10, 2019, 84 pages.
Kaufman et al., "Josephson Parametric Amplifier with Chebyshev Gain Profile and High Saturation.", arXiv:2305.17816v1, May 28, 2023, 10 pages.
Naaman et al., "Synthesis of Parametrically Coupled Networks.", PRX Quantum, vol. 3, Issue 2, May 16, 2022, 37 pages.
Roy et al., "Broadband Parametric Amplification with Impedance Engineering: Beyond the Gain- Bandwidth Product.", arXiv:1510.03065vl, Oct. 11, 2015, 12 pages.
International Search Report and Written Opinion for Application No. PCT/US2024/017698, mailed Sep. 9, 2025, 19 pages.

(Continued)

*Primary Examiner* — Andrea Lindgren Baltzell
*Assistant Examiner* — Malane Lieng
(74) *Attorney, Agent, or Firm* — DORITY & MANNING P.A.

(57) ABSTRACT

The disclosure is towards parametric amplifiers with inductive input coupling for quantum computing systems. One example aspect of the present disclosure is directed to a quantum computing system comprising a first qubit, a first measurement device, and a first amplifier. The first measurement device is configured to generate a first qubit signal corresponding to a first quantum state of the first qubit. The first amplifier is configured to amplify the first qubit signal. The first amplifier comprises a first transmission-line resonator. The first transmission-line resonator provides an inductive reactance for an electrical coupling between the first measurement device and the first amplifier. The inductive reactance for the electrical coupling enables a transmission of the first qubit signal.

20 Claims, 6 Drawing Sheets

(56) References Cited

OTHER PUBLICATIONS

White et al., "Readout of a Quantum Processor with High Dynamic Range Josephson Parametric Amplifiers", arXiv:2209.07757v2, Nov. 23, 2022, 10 pages.
International Preliminary Report on Patentability for Application No. PCT/US2024/017698, mailed Sep. 18, 2025, 13 pages.

* cited by examiner

PARAMETRIC AMPLIFIERS WITH INDUCTIVE INPUT COUPLING FOR QUANTUM COMPUTING SYSTEMS

FIELD

The present disclosure relates generally to quantum computing and information processing systems, and more particularly to parametric amplifiers with inductive input coupling for quantum computing systems.

BACKGROUND

Quantum computing is a computing method that takes advantage of quantum effects, such as superposition of basis states and entanglement to perform certain computations more efficiently than a classical digital computer. In contrast to a digital computer, which stores and manipulates information in the form of bits, e.g., a "1" or "0," quantum computing systems can manipulate information using quantum bits ("qubits"). A qubit can refer to a quantum device that enables the superposition of multiple states, e.g., data in both the "0" and "1" state, and/or to the superposition of data, itself, in the multiple states. In accordance with conventional terminology, the superposition of a "0" and "1" state in a quantum system may be represented, e.g., as a $|0\rangle +b|1\rangle$ The "0" and "1" states of a digital computer are analogous to the $|0\rangle$ and $|1\rangle$ basis states, respectively of a qubit.

SUMMARY

Aspects and advantages of embodiments of the present disclosure will be set forth in part in the following description, or can be learned from the description, or can be learned through practice of the embodiments.

One example aspect of the present disclosure is directed to a quantum computing system comprising a first qubit, a first measurement device, and a first amplifier. The first measurement device is configured to generate a first qubit signal corresponding to a first quantum state of the first qubit. The first amplifier is configured to amplify the first qubit signal. The first amplifier comprises a first transmission-line resonator. The first transmission-line resonator provides an inductive reactance for an electrical coupling between the first measurement device and the first amplifier. The inductive reactance for the electrical coupling enables a transmission of the first qubit signal.

Other aspects of the present disclosure are directed to various systems, methods, apparatuses, non-transitory computer-readable media, computer-readable instructions, and computing devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, explain the related principles.

BRIEF DESCRIPTION OF THE DRAWINGS

Detailed discussion of embodiments directed to one of ordinary skill in the art is set forth in the specification, which refers to the appended figures, in which.

DETAILED DESCRIPTION

Figure 1:
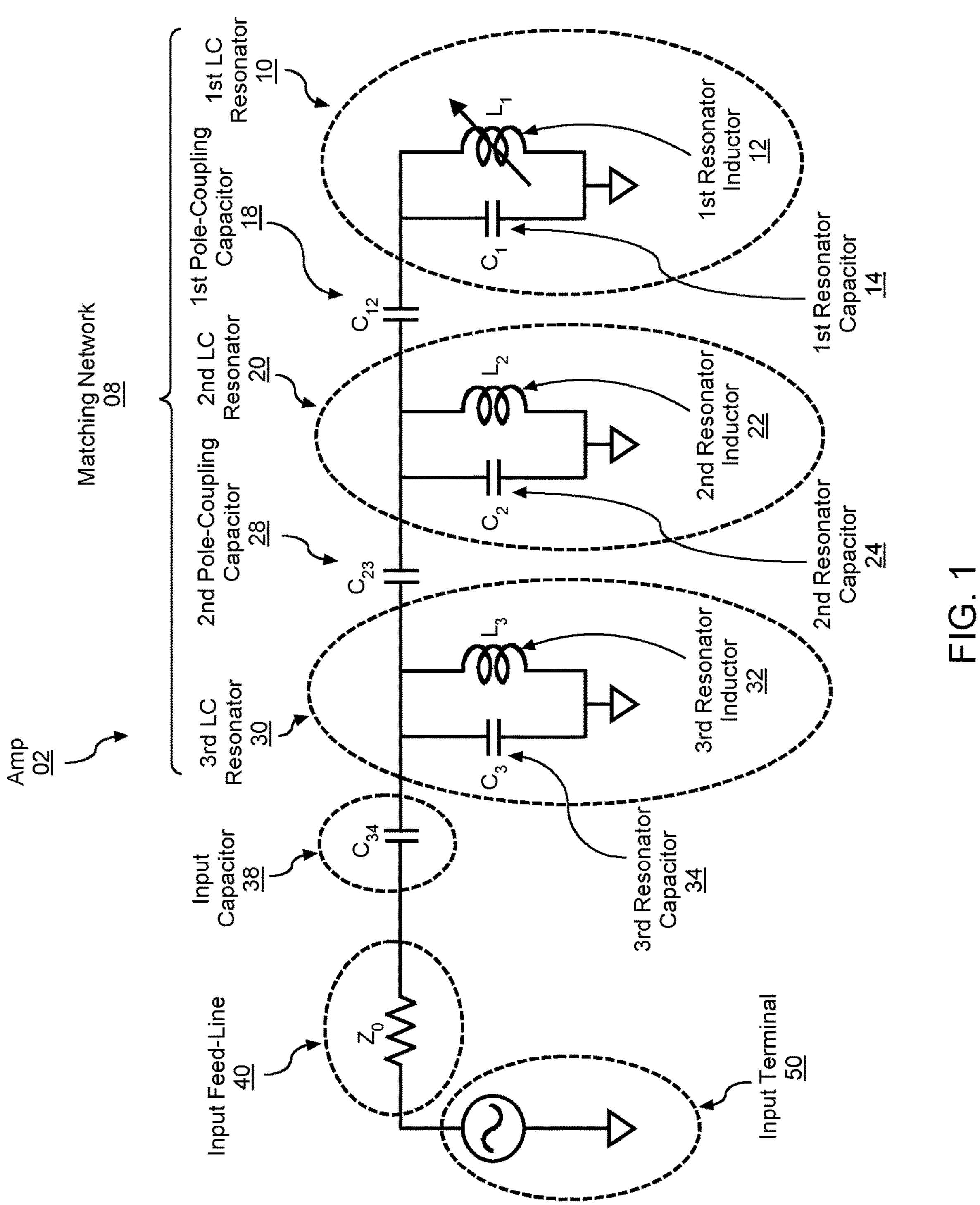
FIG. 1 provides a schematic diagram of a parametric amplifier.

Example aspects of the present disclosure are directed to methods, architectures, and hardware configurations that provide for the resetting of quantum states of multi-state devices (e.g., qubits) via tunable energy-transfer devices (e.g., tunable qubit couplers) within quantum computing systems. In quantum computing systems, a qubit has two or more possible "pure" quantum states, where the "pure" states are defined with respect to eigenstates of a particular qubit measurement apparatus (or the eigenstates of a matrix operator that corresponds to the measurement apparatus). At least two of the possible quantum states are employed as information-carrying states and are thus referred to as computational states of the qubits. A qubit may have more possible pure states that are in addition to its computational states. For instance, the quantum states of a qubit may include non-computational states. Also note that prior to an apparent "collapse" of its wavefunction, which happens when the qubit's wavefunction is entangled with the wavefunction of the measurement apparatus (e.g., a qubit measurement is performed), a qubit may be in any possible "superposition" of its pure states (e.g., defined by a complex-valued amplitude for each pure state subject to an overall normalization constraint and the irrelevancy of any overall phase on the amplitudes).

Josephson parametric amplifiers (JPA) may be utilized in quantum computing systems (e.g., quantum computing systems that employ superconducting qubits (e.g., transmon qubits)). Such systems may rely on dispersive readout operations of its qubits. A JPA may be utilized to provide a first gain stage with near quantum-limited noise, enabling fast and accurate detection of low-power readout signals. A JPA may be followed with low-noise cryogenic amplifiers and room-temperature receivers. In such applications, it is advantageous for JPAs to have both (1) high-instantaneous bandwidth to accommodate sufficient spectral separation between readout tones and (2) high dynamic range to avoid loss of readout fidelity due to gain compression and intermodulation distortion.

The embodiments include JPAs that meet both of the above design goals (e.g., high-instantaneous bandwidth and high dynamic range), such that the JPAs of the embodiments can be utilized to enable various quantum computing systems. More specifically, the JPAs of the embodiments have a multi-pole matching network (e.g., an impedance matching network) and a quarter-wave resonator along a transmission line that is an input to the multi-pole matching network (and thus an input to the JPA). The multi-pole network of the JPA increases the bandwidth of the JPA, while the resonator serves to invert an input coupling reactance from a capacitive reactance to an inductive reactance. Because the coupling of the JPA to the input signal is inductive (rather than capacitive), unwanted resonances within the JPA are mitigated.

Some JPA designs may use a multi-pole matching network (e.g., an impedance matching network) to increase the JPA's bandwidth. However, such JPAs are typically designed with lumped element LC resonators with capacitive mutual coupling which may result in unwanted resonances with other components of the JPA, or components in electrical contact with the JPA (e.g., circuit elements external to the JPA).

FIG. 1 provides a schematic diagram of a parametric amplifier 02. Parametric amplifier 02 may be a JPA and may include matching network 08. Matching network 08 may be a multi-pole matching network that includes three poles: a first pole, a second pole, and a third pole. The first pole may include a first LC resonator 10, the second pole may include a second LC resonator 20, and the third pole may include a third LC resonator 30. Being a lumped element LC resonator, the first LC resonator 10 includes a first resonator inductor 12 (e.g., with a variable first inductance $L_1$) and a first resonator capacitor 14 (e.g., with a first capacitance $C_1$). Similarly, the second LC resonator 20 includes a second resonator inductor 22 (e.g., with a second inductance $L_2$) and a second resonator capacitor 24 (e.g., with a second capacitance $C_2$). The third LC resonator 30 includes a third resonator inductor 32 (e.g., with a third inductance $L_3$) and a third resonator capacitor 34 (e.g., with a third capacitance $C_3$). The first LC resonator 10 is electrically coupled to the second LC resonator 20 via a first pole-coupling capacitor 18 (e.g., with a capacitance $C_{12}$). The second LC resonator 20 is electrically coupled to the third LC resonator 30 via a second pole-coupling capacitor 28 (e.g., with a capacitance $C_{23}$). The first resonator inductor 12, with the variable inductance at least partially enables the amplification of the parametric amplifier 02. For instance, when the variable inductance of the first resonator inductor 12 is modulated at a certain frequency (the "pump frequency"), the parametric amplifier 02 can amplify signals near half of the pump frequency.

The parametric amplifier 02 has an input terminal 50. In the parametric amplifier 02, the input terminal 50 is coupled to the matching network 08 via an input capacitor 38 (e.g., with a capacitance $C_{34}$) and an input feed-line 40 (e.g., with an input impedance magnitude (or resistance) noted as $Z_0$). Note that the input capacitor 38 results in the input coupling reactance of the parametric amplifier 02 to be a capacitive input coupling reactance. The capacitive reactance may result in unwanted resonances within the parametric amplifier 02. Specifically, the input capacitor 38 tends to be large (e.g., $Z_0 \cdot \omega_0 \cdot C_{34} >> 1$, where $\omega_0$ is the center frequency for parametric amplifier 02), and may itself resonate with other reactance external (e.g., bond wires and lengths of traces on the chip or the package) to the parametric amplifier 02. The additional resonance in the circuit is uncontrolled and ultimately degrades the performance of the parametric amplifier 02, e.g., resulting in out-of-spec gain ripple.

In various embodiments, the capacitance of the input capacitor 38 may be rather larger (e.g., $Z_0 \cdot \omega_0 \cdot C_{34} > 1$). For example, when amplifier 02 is designed for center frequency of 4.5 GHz and a bandwidth of 500 MHZ, $C_{34}$ can be greater than 1 pF. Although not shown in FIG. 1, the input capacitor 38 may be further connected to a 50 Ohm (Ω) transmission line on chip with a length of a few mm to get from the amplifier to the bond pads. This length, combined with the inductance of the wirebonds can create a stray resonance whose frequency is close to the frequency of the amplifier, which can result in a degradation of gain or ripple of the amplifier. With a capacitive input coupling to a lumped-elements resonator (e.g., at that of parametric amplifier 02) may have a frequency-dependent reactance. That is, parametric amplifier 02 may only be employed at a narrow band of input frequencies. Due to the target coupling only occurring at a single frequency, the applicability of parametric amplifier 02 may be limited for quantum computing systems.

Figure 3:
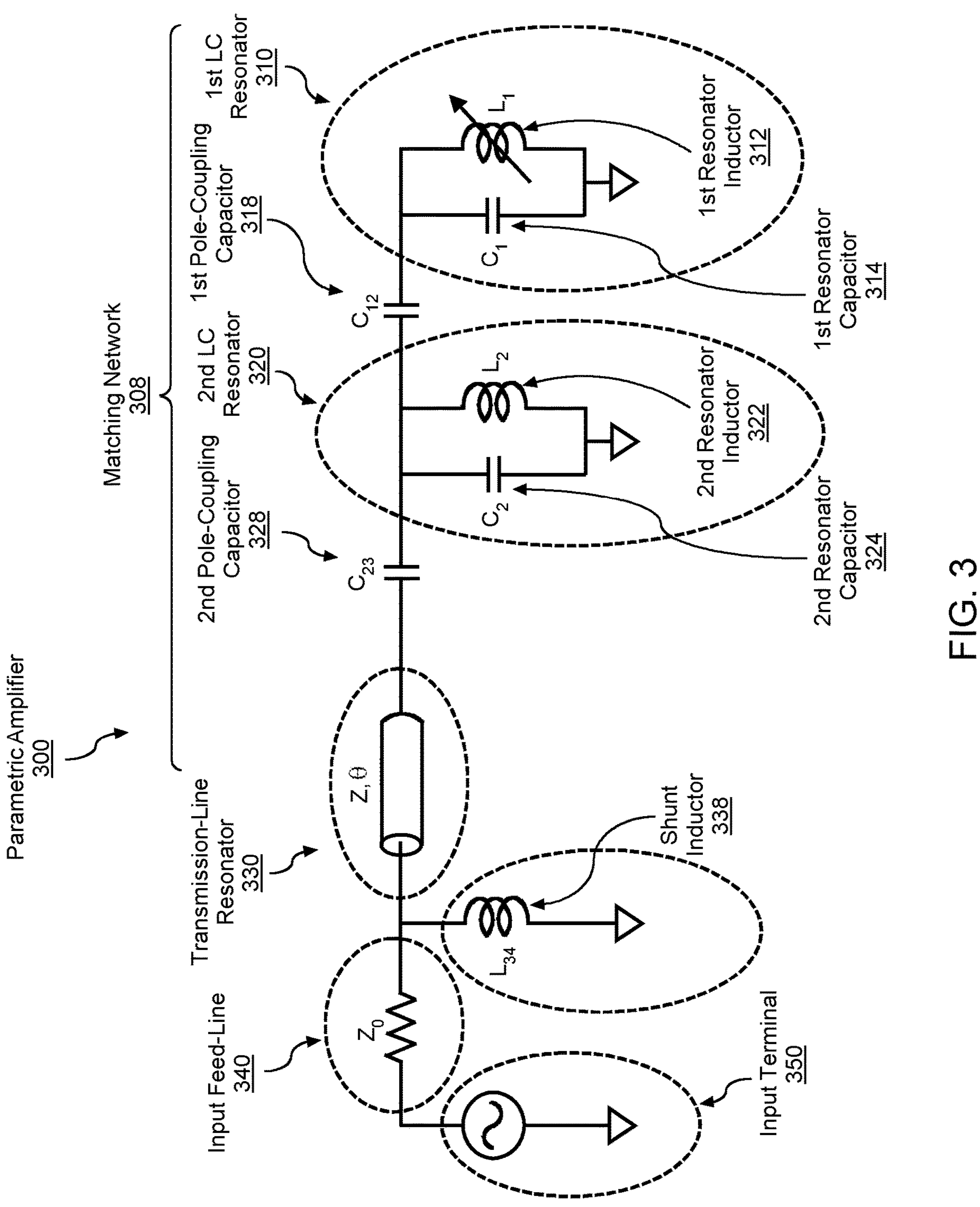
FIG. 3 provides a schematic diagram of a parametric amplifier, according to various embodiments.

To address these issues and other issues with the parametric amplifier 02, and as noted above, the embodiments replace the third LC resonator 30 in the matching network 08 with a quarter-wave transmission line resonator, e.g., see FIG. 3. The quarter-wave transmission line resonator of the embodiments inverts the input coupling reactance from capacitive to inductive. Therefore the JPAs of the embodiments can be inductively coupled to an input terminal of the JPA. Since the reactance is inductive this diminishes the possibility of unintended resonances near the amplifier's operating frequency. The quarter-wave transmission-line resonator additionally helps in covering the physical distance on the chip from the bond-pads to the device, thus further reducing stray resonances associated with wiring over this distance.

Aspects of the present disclosure provide a number of technical effects and benefits. For instance, as noted above, the JPAs of the embodiments achieve at least two design goals (e.g., high-instantaneous bandwidth and high dynamic range) associated with the JPAs employed in quantum computing systems, while simultaneously mitigate stray resonances. More specifically, the JPAs of the embodiments may be employed to reliably amplify qubit-read signals in quantum computing systems, while mitigating unwanted resonances. A variable inductance included in the embodiments further help achieve these design goals. Accordingly, the embodiments may be employed to enable various quantum computing systems.

Figure 2:
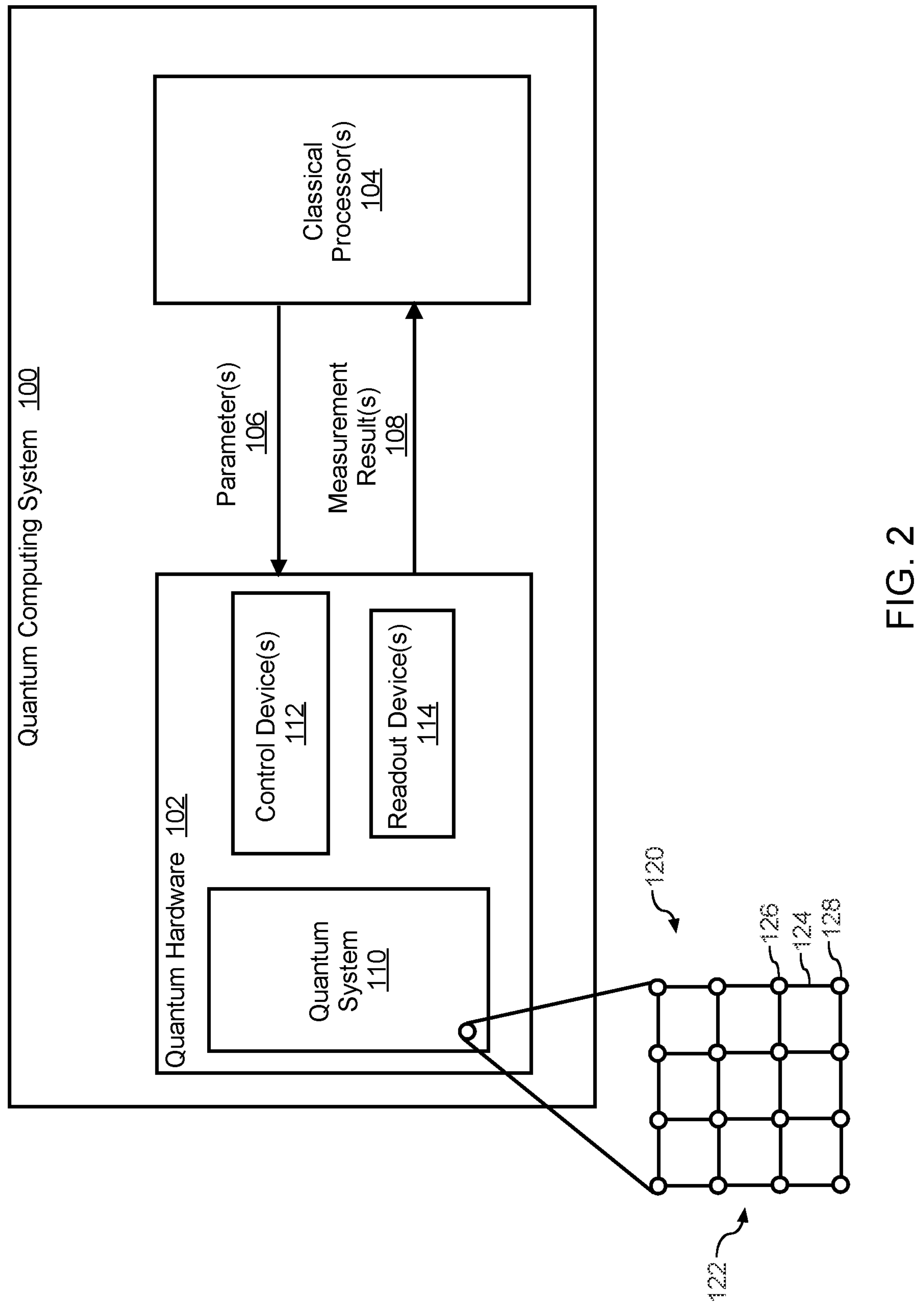
FIG. 2 depicts an example quantum computing system according to example embodiments of the present disclosure.

FIG. 2 depicts an example quantum computing system 100. The system 100 is an example of a system of one or more classical computers and/or quantum computing devices in one or more locations, in which the systems, components, and techniques described below can be implemented. Those of ordinary skill in the art, using the disclosures provided herein, will understand that other quantum computing devices or systems can be used without deviating from the scope of the present disclosure.

The system 100 includes quantum hardware 102 in data communication with one or more classical processors 104. The classical processors 104 can be configured to execute computer-readable instructions stored in one or more memory devices to perform operations, such as any of the operations described herein. The quantum hardware 102 includes components for performing quantum computation. For example, the quantum hardware 102 includes a quantum system 110, control device(s) 112, and readout device(s) 114 (e.g., readout resonator(s)). The quantum system 110 can include one or more multi-level quantum subsystems, such as a register of qubits (e.g., qubits 120). In some implementations, the multi-level quantum subsystems can include superconducting qubits, such as flux qubits, charge qubits, transmon qubits, gmon qubits, spin-based qubits, and the like.

The type of multi-level quantum subsystems that the system 100 utilizes may vary. For example, in some cases it may be convenient to include one or more readout device(s) 114 attached to one or more superconducting qubits, e.g., transmon, flux, gmon, xmon, or other qubits. In other cases, ion traps, photonic devices or superconducting cavities (e.g., with which states may be prepared without requiring qubits) may be used. Further examples of realizations of multi-level quantum subsystems include fluxmon qubits, silicon quantum dots or phosphorus impurity qubits. A readout device of the readout devices 114 may be referred to as a qubit measurement device. For instance, the readout devices 114 may include qubit measurement device 510 of FIG. 5.

Quantum circuits may be constructed and applied to the register of qubits included in the quantum system 110 via multiple control lines that are coupled to one or more control devices 112. Example control devices 112 that operate on the register of qubits can be used to implement quantum gates or quantum circuits having a plurality of quantum gates, e.g., Pauli gates, Hadamard gates, controlled-NOT (CNOT) gates, controlled-phase gates, T gates, multi-qubit quantum gates, coupler quantum gates, etc. The one or more control devices 112 may be configured to operate on the quantum system 110 through one or more respective control parameters (e.g., one or more physical control parameters). For example, in some implementations, the multi-level quantum subsystems may be superconducting qubits and the control devices 112 may be configured to provide control pulses to control lines to generate magnetic fields to adjust the frequency of the qubits.

The quantum hardware 102 may further include readout devices 114 (e.g., readout resonators). Measurement results 108 obtained via measurement devices may be provided to the classical processors 104 for processing and analyzing. In some implementations, the quantum hardware 102 may include a quantum circuit and the control device(s) 112 and readout devices(s) 114 may implement one or more quantum logic gates that operate on the quantum computing system 100 through physical control parameters (e.g., microwave pulses) that are sent through wires included in the quantum hardware 102. Further examples of control devices include arbitrary waveform generators, wherein a DAC (digital to analog converter) creates the signal.

The readout device(s) 114 may be configured to perform quantum measurements on the quantum system 110 and send measurement results 108 to the classical processors 104. In some embodiments, the measurement results are encoded in the form of a qubit output signal (e.g., qubit output signal 512 of FIG. 5). In such embodiments, a parametric amplifier (e.g., parametric amplifier 300 of FIG. 3 and/or parametric amplifier 520 of FIG. 5) may be employed to amplify such signals, e.g., a parametric amplifier may be positioned on a transmission line that transmits the measurement results 108 from the readout devices 114 to the classical processor 104. In addition, the quantum hardware 102 may be configured to receive data specifying physical control qubit parameter values 106 from the classical processors 104. The quantum hardware 102 may use the received physical control qubit parameter values 106 to update the action of the control device(s) 112 and readout devices(s) 114 on the quantum system 110. For example, the quantum hardware 102 may receive data specifying new values representing voltage strengths of one or more DACs included in the control devices 112 and may update the action of the DACs on the quantum system 110 accordingly. The classical processors 104 may be configured to initialize the quantum system 110 in an initial quantum state, e.g., by sending data to the quantum hardware 102 specifying an initial set of parameters 106.

In some implementations, the readout device(s) 114 can take advantage of a difference in the impedance for the $|0\rangle$ and $|1\rangle$ states of an element of the quantum system, such as a qubit, to measure the state of the element (e.g., the qubit). For example, the resonance frequency of a readout resonator can take on different values when a qubit is in the state $|0\rangle$ or the state $|1\rangle$, due to the nonlinearity of the qubit. Therefore, a microwave pulse reflected from the readout device 114 carries an amplitude and phase shift that depend on the qubit state. In some implementations, a Purcell filter can be used in conjunction with the readout device(s) 114 to impede microwave propagation at the qubit frequency.

In some embodiments, the quantum system 110 can include a plurality of qubits 120 arranged, for instance, in a two-dimensional grid 122. For clarity, the two-dimensional grid 122 depicted in FIG. 2 includes 4×4 qubits, however in some implementations the system 110 may include a smaller or a larger number of qubits. In some embodiments, the multiple qubits 120 can interact with each other through multiple qubit couplers, e.g., qubit coupler 124. The qubit couplers can define nearest neighbor interactions between the multiple qubits 120. In some implementations, the strengths of the multiple qubit couplers are tunable parameters. In some cases, the multiple qubit couplers included in the quantum computing system 100 may be couplers with a fixed coupling strength.

In some implementations, the multiple qubits 120 may include data qubits, such as qubit 126 and measurement qubits, such as qubit. A data qubit is a qubit that participates in a computation being performed by the system 100. A measurement qubit is a qubit that may be used to determine an outcome of a computation performed by the data qubit. That is, during a computation an unknown state of the data qubit is transferred to the measurement qubit using a suitable physical operation and measured via a suitable measurement operation performed on the measurement qubit.

In some implementations, each qubit in the multiple qubits 120 can be operated using respective operating frequencies, such as an idling frequency and/or an interaction frequency and/or readout frequency and/or reset frequency. The operating frequencies can vary from qubit to qubit. For instance, each qubit may idle at a different operating frequency. The operating frequencies for the qubits 120 can be chosen before a computation is performed.

FIG. 2 depicts one example quantum computing system that can be used to implement the methods and operations according to example aspects of the present disclosure. Other quantum computing systems can be used without deviating from the scope of the present disclosure.

FIG. 3 provides a schematic diagram of a parametric amplifier 300, according to various embodiments. Parametric amplifier 300 may be a Josephson parametric amplifier (JPA). Parametric amplifier 300 may include a matching network 308 (e.g., an impedance matching network). Matching network 308 may be a multi-pole matching network that includes three poles: a first pole, a second pole, and a third pole. The first pole may include a first LC resonator 310 and the second pole may include a second LC resonator 320. The third pole may include a first transmission-line resonator (e.g., transmission-line resonator 330). The transmission-line resonator 330 may be characterized by an impedance (e.g., Z). the transmission-line resonator 330 may be a quarter-wavelength transmission-line resonator (e.g., θ represents the electrical length of the transmission line of the transmission-line resonator 330). In some embodiments, $\theta=\omega\cdot\tau$, where $\omega$ is the frequency at which the length is specified at, and $\tau$ is the electrical delay for that length of the transmission line. The parametric amplifier 300 may additionally include shunt inductor 338. Being a lumped element LC resonator, the first LC resonator 310 includes a first resonator inductor 312 (e.g., with a variable first inductance $L_1$) and a first resonator capacitor 314 (e.g., with a first capacitance $C_1$). In some embodiments, the first resonator inductor 312 may be constructed from Josephson junctions or arrays of Josephson junctions. In other embodiments, the first resonator inductor 312 may be constructed superconducting quantum interference devices (SQUIDs) or arrays of SQUIDS (e.g., an array of radiofrequency (RF)-SQUIDS. In some embodiments, DC-SQUIDs may be employed in the construction of the first resonator inductor 312. In other embodiments, RF-SQUIDS may be employed in the construction of the first resonator inductor 312. When arrays of RF-SQUIDs are used, the parametric amplifier 300 can achieve high dynamic range as discussed above.

Similarly, the second LC resonator 320 includes a second resonator inductor 322 (e.g., with a second inductance $L_2$) and a second resonator capacitor 324 (e.g., with a second capacitance $C_2$). In contrast to the third LC resonator 30 of FIG. 1, the third pole of parametric amplifier includes the transmission-line resonator 330. The first LC resonator 310 is electrically coupled to the second LC resonator 320 via a first pole-coupling capacitor 318 (e.g., with a capacitance $C_{12}$). The second LC resonator 320 is electrically coupled to the transmission-line resonator 330 via a second pole-coupling capacitor 328 (e.g., with a capacitance $C_{23}$). The first resonator inductor 312, with the variable inductance at least partially enables the amplification of the parametric amplifier 300. For instance, when the variable inductance of the first resonator inductor 312 is modulated at a certain frequency (the "pump frequency"), the parametric amplifier 300 can amplify signals near half of the pump frequency.

The parametric amplifier 300 has one or more input terminals, e.g., input terminal 350. The matching network 308 is electrically coupled to the input terminal 350 via the input feed-line 340 and the shunt inductor 338 (e.g., with an inductance of $L_{34}$). Note, that in contrast with capacitive coupling between the input terminal 50 and the matching network 08 of amplifier 02 of FIG. 1, the electric coupling between the input terminal 350 and the matching network 308 of parametric amplifier 300 is inductive and at least partially enabled via the transmission-line resonator 330 and the shunt inductor 338. In some embodiments, the input feed-line 340 is an input feed-line, while in other embodiments, the input feed-line 340 is an feed-line (e.g., with an impedance magnitude (or resistance) of $Z_0$).

Comparing amplifier 02 of FIG. 1 and parametric amplifier 300 of FIG. 3, in FIG. 3, the third LC resonator 30 in the matching network 08 (of amplifier 02) has been replaced with the transmission-line resonator 330 in matching network 308 of parametric amplifier 300. The transmission-line resonator 330 may be a quarter-wave transmission-line resonator that inverts the input coupling reactance from capacitive (e.g., as in FIG. 1) to inductive (e.g., as in FIG. 3). Therefore, the parametric amplifier 300 can be inductively coupled to the signal input circuit (e.g., via input terminal 350). Since the reactance is now inductive, this mitigates unintended resonances. The transmission-line resonator 330 additionally helps in covering the physical distance on the chip from the bond-pads to the device, thus further reducing stray resonances associated with wiring over this distance. Also note that the input capacitor 38 of amplifier 02 has been replaced with the shunt inductor 330 in parametric amplifier 300.

The use of an inductive coupling (facilitated by the use of the quarter wave transmission-line resonator 330) may at least partially mitigate resonances between the bond wires and the input to the parametric amplifier 300. In addition, the length of the transmission-line resonator 330 may be sufficient to cover any physical distance between the amplifier and the bond pad, removing the need for additional wiring transmission line and any stray resonances associated with that extra length.

As noted in the above discussion in conjunction with FIG. 1, the input capacitor 38 (or amplifier 02) may be connected to a 50Ω feed. Referring to FIG. 1, a coupling between a lumped parallel LC (e.g., third LC resonator 30) and a 50Ω feed. The coupling between the input capacitor 38 and the 50Ω feed may need to be approximated, since the admittance inverter is supposed to have a negative compensating capacitance which may not be able to be absorbed on the 50Ω side. This approximation tends to add significant frequency dependence to the coupling, and can limit the bandwidth of the design. Thus, using the transmission-line resonator 330 has another advantage, since the coupling is now inductive (rather than capacitive as in FIG. 1) in that, there is no need to absorb a negative reactance on the 50Ω side when the transmission-line resonator 330 is employed in the parametric amplifier 300. The symmetry between the transmission-line resonator 330 and the input feed-line 340 may make it more amenable to absorbing the negative reactance. Both input feed-line 340 and the transmission-line resonator 330 may be shortened to absorb that negative reactance.

In the non-limiting embodiment shown in FIG. 3, the matching network has three matching sections (or poles). However, the embodiments are not so limited and the matching network 308 can have any number of matching sections (or poles). For instance, parametric amplifier 300 may be readily generalized to 2 or 4 sections as well. Further, other resonators can be implemented as the transmission-line resonator 330, e.g., either quarter wave or half wave. The advantages of using transmission-line resonator 330 includes the fact that transmission-line resonators may be readily implemented with modest fabrication resources, for example with a single layer planar fabrication process. The coupling shunt inductor 338 may be further be realized by a shorted transmission line with an electrical length of 45 degrees, as per a Richard's transformation.

Figure 4:
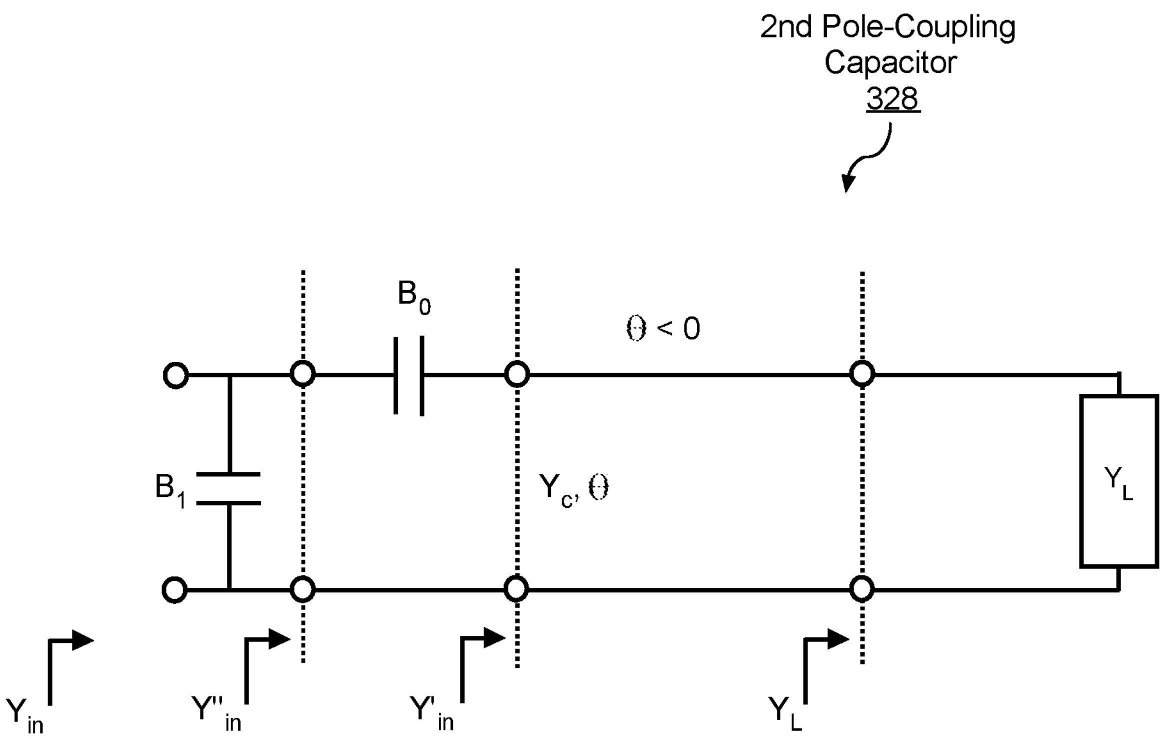
FIG. 4 provides a circuit-level diagram of the parametric amplifier of FIG. 3 that indicates quantities that are used in a calculation of the capacitive value of the second pole-coupling capacitor of the parametric amplifier, according to various embodiments.

Comparing FIG. 1 and FIG. 3, because the second pole-coupling capacitor 328 (of FIG. 3) couples a lumped element LC resonator on one side (e.g., the second LC resonator 320) and a transmission-line resonator 330 on the other side, its capacitive value (e.g., $C_{23}$) may be calculated differently from the expressions used for calculating the capacitive value of second pole-coupling capacitor 28 in FIG. 1. FIG. 4 provides a circuit-level diagram of a portion of the parametric amplifier 300 of FIG. 3 that indicates quantities that are used in a calculation of the capacitive value of the second pole-coupling capacitor 328 of parametric amplifier 300, according to various embodiments. In FIG. 4, $B_0$ may be the reactance of the second pole-coupling capacitor 328, $B_1$ may be the negative reactance that needs to compensate for the coupling capacitance B0, and $\theta$ may be the transmission length of the transmission-line resonator 330. $Y_{in}$ is the input admittance (e.g., the reciprocal on impedance) and may be calculated as:

$$Y_{in} = \frac{1}{Y_{Ll}}\left[\frac{Y_c \cdot \tan\theta}{\sqrt{1+\tan^2\theta}}\right]^2.$$

If this structure is to serve as an admittance inverter with value J, then we may constrain have $Y_{in}=J^2/Y_L$. Substituting this constraint into the above equation, it is found that:

$$J = \frac{Y_c \cdot \tan\theta}{\sqrt{1+\tan^2\theta}}.$$

The reactances $B_0$ and $B_1$ may be written in terms of J as:

$$B_0 = \frac{J}{\sqrt{1-\left(\frac{J}{Y_c}\right)^2}}$$

$$B_1 = -J \times \sqrt{1-\left(\frac{J}{Y_c}\right)^2}$$

The compensating line length of the transmission-line resonator 330 may be calculated as follows:

$$\theta = \tan^{-1}\left(\frac{B_0}{Y_c}\right).$$

The capacitance of the second pole-coupling capacitor 328 (e.g., $C_{23}$) is related to B0 and a compensating capacitance that is related to B1 can be written as:

$$C_0 = \frac{B_0}{\omega_0}$$

$$C_1 = \frac{B_1}{\omega_0}$$

Figure 5:
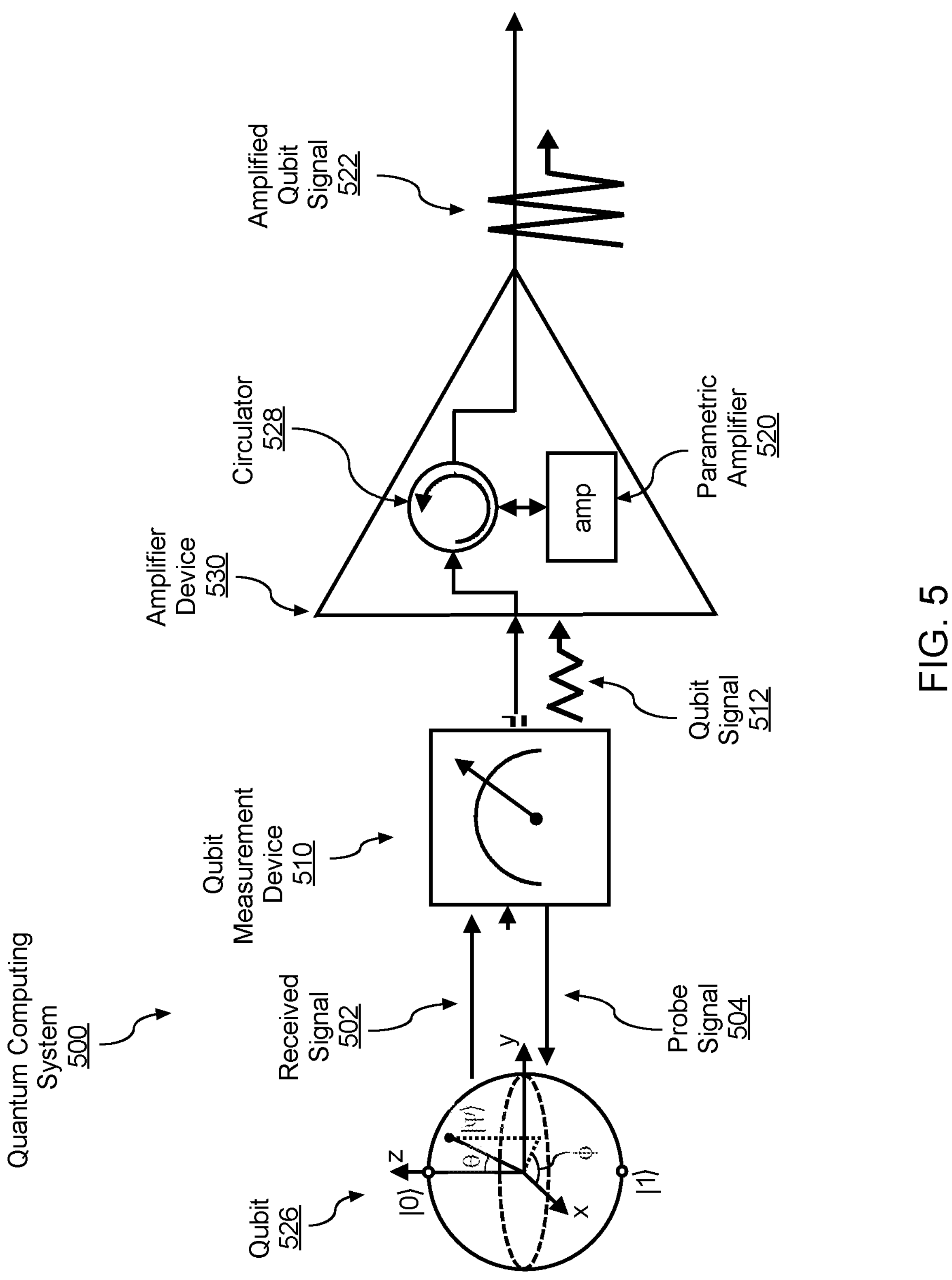
FIG. 5 depicts another example quantum computing system, according to example embodiments of the present disclosure.

FIG. 5 depicts another example quantum computing system 500, according to example embodiments of the present disclosure. Quantum computing system 500 may be similar to quantum computing system 100 of FIG. 2. As such, quantum computing system 500 may include qubits that include at least a first qubit (e.g., qubit 526). Qubit 526 has a quantum state. Qubit 526 may be a superconducting transmon qubit. The quantum state of qubit 526 may be encoded in a wavefunction that is represented as a projection on the surface of a Bloch sphere, as shown in FIG. 5. Quantum computing system 500 also includes at least a first qubit measurement device (e.g., qubit measurement device 510). The qubit measurement device 510 is enabled to measure (or observe) the quantum state of the qubit 526 (via the received signal 502). The qubit measurement device 510 may be readout device included in the readout devices 114 of quantum computing system 100. The qubit measurement device 510 may receive the received signal 502 from the qubit 526. Accordingly, the qubit measurement device 510 is configured to generate a first qubit signal (e.g., qubit signal 512) that corresponds to the quantum state of qubit 526. The qubit signal 512 may be an embodiment of the measurement results 108 in quantum computing system 100. Note when the quantum state of qubit 526 is measured by qubit measurement device 510, the wavefunction of the quantum state may collapse to a single eigenstate of the qubit measurement device 510.

Quantum computing system 500 may additionally include a first amplifier (e.g., parametric amplifier 520). Note that parametric amplifier 520 may be employed in amplifier device 530. The parametric amplifier 520 may be similar to parametric amplifier 300 of FIG. 3. In addition to the parametric amplifier 520, the amplifier device 530 may include a circulator 528. The circulator 538 may be a 3-port circulator such that the amplifier device 530 is operated as a reflection amplifier.

There is an electrical coupling between the qubit measurement device 510 and the parametric amplifier 520 (e.g., via the circulator 528). As such, parametric amplifier 520 may be configured to amplify the qubit signal 512 via the electrical coupling. Thus, when the qubit signal 512 is provided as an input to the parametric amplifier 520, the parametric amplifier 520 may provide an amplified qubit signal 522 as an output. Note that in quantum computing system 100 of FIG. 2, the amplifier device 530 (e.g., including the parametric amplifier 520) may be positioned along a transmission line that transmits measurement results 108. For instance, the parametric amplifier 520 may be located along a transmission line coupling the readout devices 114 and the classical processor 104 of quantum computing system 100. Via the circulator 528, a probe signal 502 may be fed back to the qubit 526.

As noted above, parametric amplifier 520 may be similar to (or equivalent to) parametric amplifier 300 of FIG. 3. Thus, parametric amplifier 520 may be a Josephson parametric amplifier (JPA). As such, parametric amplifier 520 may include a first transmission-line resonator (e.g., transmission-line resonator 330 of FIG. 3). As discussed in conjunction with FIG. 3, the transmission-line resonator provides an inductive reactance for the electrical coupling between the qubit measurement device 510 and the parametric amplifier 520. The inductive coupling between the qubit measurement device 510 and the parametric amplifier 520 enables a transmission of the qubit signal 512.

Being similar (or equivalent to parametric amplifier 300 of FIG. 3, although not explicitly shown in FIG. 5, parametric amplifier 520 may include a multi-polar impedance matching network (e.g., matching network 308 of FIG. 3). As such, the multi-polar impedance matching network of parametric amplifier 520 may include a first pole, a second pole, and a third pole. The third pole may include the transmission-line resonator. The third pole of parametric amplifier 520 may further include a terminal transmission line. The terminal transmission line of the third pole may include a shunt inductor (e.g., shunt inductor 338 of FIG. 3). The transmission-line resonator may electrically (e.g., inductively) couple a terminal line (e.g., input terminal 350 of FIG. 3) of the parametric amplifier 520 to one or more poles of the impedance matching network of the parametric amplifier 520.

The first pole of the multi-polar impedance matching network include a first inductive-capacitive (LC) resonating circuit (e.g., first LC resonator 310 of FIG. 3) and a second LC resonating circuit (e.g., second LC resonator 320 of FIG. 3). A capacitor (e.g., second pole-coupling capacitor 328 of FIG. 3) may electrically (e.g., capacitively) couple the transmission-line resonator to the second LC resonating circuit. A second capacitor (e.g., first pole-coupling capacitor 318 of FIG. 3) may electrically (e.g., capacitively) couple the first LC resonating circuit and the second LC resonating circuit.

Although not shown explicitly in FIG. 5, the quantum computing system 500 may include a set of qubits, a set of transmission lines, and a set of Josephson parametric amplifiers (JPAs). Each JPA of the set of JPAs may be similar to (or equivalent to) parametric amplifier 300 of FIG. 3 and/or parametric amplifier 520 of FIG. 5. Thus, the set of JPAs may include the parametric amplifier 300 of FIG. 3 and/or the parametric amplifier 520. The set of qubits may include the qubit 526. As such, each qubit of the set of qubits may be a superconducting transmon qubit. Each transmission line of the set of transmission lines may be configured to transmit a qubit signal (e.g., qubit signal 512) that encodes a measurement of a quantum state (e.g., a measurement performed by a qubit measurement device such as but not limited to qubit measurement device 510) of a corresponding qubit of the set of qubits. Each JPA of the set of JPAs may include a transmission-line resonator (e.g., transmission-line resonator 330 of FIG. 3). The transmission-line resonator of a JPA may inductively couple the JPA, via an inductive reactance, to a corresponding transmission line of the set of transmission lines. A transmission line corresponding to a JPA may inductively provide the qubit signal to the JPA for amplification.

Figure 6:
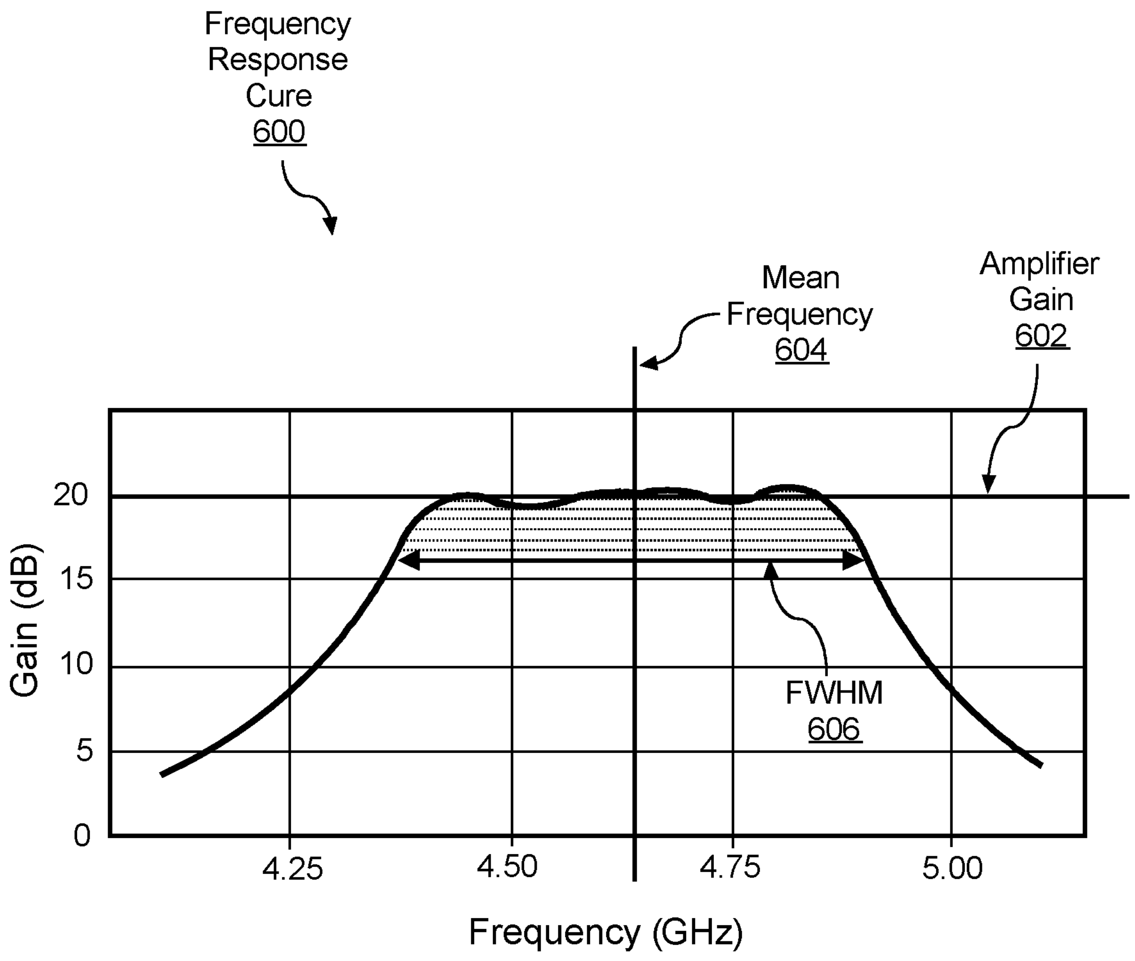
FIG. 6 shows a non-limiting frequency response curve for the parametric amplifiers of FIGS. 3 and 5, according to various embodiments.

FIG. 6 shows a non-limiting frequency response curve 600 for the parametric amplifiers of FIGS. 3 and 5, according to various embodiments. That is, the frequency response curve 600 may be similar to frequency response curves of parametric amplifier 300 of FIG. 3 and/or parametric amplifier 500 of FIG. 5. Frequency response curve 600 may characterize a bandwidth of the parametric amplifier. FIG. 6 shows an amplifier gain 602 of approximately 20 decibels (dBs) for the parametric amplifier. In some embodiments, the amplifier gain 602 is within the range of 15-25 decibels (dBs). The bandwidth of the parametric amplifier may have a mean frequency 604 of approximately 4.6 GHz and a full-width-half-max (e.g., FWHM 606) of approximately 400 MHZ. In other non-limiting embodiments, the mean frequency 604 may be approximately 10 GHZ. In some embodiments, a parametric amplifier of the embodiments may be designed to have a mean frequency 604 somewhere in the range of 4-10 GHz. The FWHM 606 may be within the range of 200-600 MHz.

Implementations of the digital, classical, and/or quantum subject matter and the digital functional operations and quantum operations described in this specification can be implemented in digital electronic circuitry, suitable quantum circuitry or, more generally, quantum computational systems, in tangibly-implemented digital and/or quantum computer software or firmware, in digital and/or quantum computer hardware, including the structures disclosed in this specification and their structural equivalents, or in combinations of one or more of them. The term "quantum computing systems" may include, but is not limited to, quantum computers/computing systems, quantum information processing systems, quantum cryptography systems, or quantum simulators.

Implementations of the digital, classical, and/or quantum subject matter and the digital functional operations and quantum operations described in this specification can be implemented in digital electronic circuitry, suitable quantum circuitry or, more generally, quantum computational systems, in tangibly-implemented digital and/or quantum computer software or firmware, in digital and/or quantum computer hardware, including the structures disclosed in this specification and their structural equivalents, or in combinations of one or more of them. The term "quantum computing systems" may include, but is not limited to, quantum computers/computing systems, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits/qubit structures, or a combination of one or more of them. Alternatively or in addition, the program instructions can be encoded on an artificially-generated propagated signal that is capable of encoding digital and/or quantum information (e.g., a machine-generated electrical, optical, or electromagnetic signal) that is generated to encode digital and/or quantum information for transmission to suitable receiver apparatus for execution by a data processing apparatus.

The terms quantum information and quantum data refer to information or data that is carried by, held, or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states (e.g., qubits) are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, or multiple digital and quantum processors or computers, and combinations thereof. The apparatus can also be, or further include, special purpose logic circuitry, e.g., an FPGA (field programmable gate array), or an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital or classical computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL, Quipper, Cirq, etc.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers or processors to be "configured to" or "operable to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum microprocessors or both, or any other kind of central digital and/or quantum processing unit. Generally, a central digital and/or quantum processing unit will receive instructions and digital and/or quantum data from a read-only memory, or a random access memory, or quantum systems suitable for transmitting quantum data, e.g. photons, or combinations thereof.

Some example elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, or optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more tangible, non-transitory machine-readable storage media, and that are executable on one or more digital and/or quantum processing devices. The systems described in this specification, or portions of them, can each be implemented as an apparatus, method, or electronic system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A quantum computing system comprising:

a first qubit;

a first measurement device configured to generate a first qubit signal corresponding to a first quantum state of the first qubit; and a first amplifier configured to amplify the first qubit signal, wherein the first amplifier comprises a first transmission-line resonator that inverts an input coupling reactance of the first amplifier from a capacitive reactance to an inductive reactance, which provides an electrical coupling between the first measurement device and the first amplifier, and the inductive reactance for the electrical coupling enables a transmission of the first qubit signal.

2. The quantum computing system of claim 1, wherein the first amplifier is a Josephson parametric amplifier.

3. The quantum computing system of claim 1, wherein the first amplifier further comprises a multi-polar impedance matching network that includes a first pole, a second pole, and a third pole.

4. The quantum computing system of claim 3, wherein the third pole includes the first transmission-line resonator.

5. The quantum computing system of claim 4, wherein a terminal transmission line of the third pole includes a shunt inductor.

6. The quantum computing system of claim 3, wherein the first pole includes a first inductive-capacitive (LC) resonating circuit and the second pole includes a second LC resonating circuit.

7. The quantum computing system of claim 6, wherein a first capacitor electrically couples the first transmission-line resonator to the second LC resonating circuit.

8. The quantum computing system of claim 7, wherein a second capacitor electrically couples the first LC-resonating circuit to the second LC resonating circuit.

9. The quantum computing system of claim 1, wherein a non-linear inductor of the first amplifier includes at least one of Josephson Junction, a direct current (DC) superconducting quantum interference device (SQUID), or a radiofrequency (RF) SQUID.

10. The quantum computing system of claim 1, wherein the first transmission-line resonator electrically couples a terminal line of the first amplifier to one or more poles of an impedance match network of the first amplifier.

11. The quantum computing system of claim 1, wherein the first amplifier has a gain of within a range of 15-25 decibels (dBs).

12. The quantum computing system of claim 1, wherein a bandwidth of the first amplifier has a mean frequency of within a range of 4-10 GHz.

13. The quantum computing system of claim 1, wherein a bandwidth of the first amplifier has a full-width half-max (FWHM) within a range of 200-600 MHz.

14. An amplifier device comprising:

a first pole that includes a first inductive-capacitive (LC) resonating circuit;

a second pole that includes a transmission-line resonator that provides an inductive reactance for an input to the amplifier device;

a third pole that includes a second LC resonating circuit; and a capacitor that electrically couples the first pole and the third pole.

15. The amplifier device of claim 14, further comprising:

a multi-polar impedance matching network that includes the first pole, the second pole, and the third pole.

16. The amplifier device of claim 14, wherein the second pole further includes a shunt inductor.

17. The amplifier device of claim 14, wherein a first inductor of the first LC resonating circuit has a variable inductance.

18. A quantum computing system comprising:

a set of qubits;

a set of transmission lines, wherein each transmission line of the set of transmission lines is configured to transmit a qubit signal that encodes a measurement of a quantum state of a corresponding qubit of the set of qubits; and a set of Josephson parametric amplifiers (JPAs), wherein each JPA of the set of JPAs includes a quarter-wavelength transmission-line resonator that electrically couples, via an inductive reactance, the respective JPA to a corresponding transmission line of the set of transmission lines such that the corresponding transmission line inductively provides its qubit signal to the respective JPA for amplification.

19. The quantum computing system of claim 18, wherein the quarter-wavelength transmission-line resonator of the respective JPA is configured to invert an input coupling reactance of the respective JPA from a capacitive reactance to the inductive reactance.

20. The quantum computing system of claim 1, wherein the first transmission-line resonator is a quarter-wavelength resonator.

* * * * *